United States Patent [19]

Dodge

[11] 4,316,448
[45] Feb. 23, 1982

[54] SOLAR ENERGY CONCENTRATOR SYSTEM

[75] Inventor: Robert J. Dodge, Houston, Tex.

[73] Assignee: Pennwalt Corporation, Philadelphia, Pa.

[21] Appl. No.: 194,536

[22] Filed: Oct. 6, 1980

[51] Int. Cl.³ .............................. F24J 3/02; G02B 7/18
[52] U.S. Cl. .................... 126/424; 126/438; 126/450; 350/298
[58] Field of Search ............... 126/438, 439, 424, 425, 126/450, 417; 350/288, 298, 299, 300

[56] References Cited

U.S. PATENT DOCUMENTS

| | | | |
|---|---|---|---|
| 2,969,788 | 1/1961 | Newton | 126/439 |
| 4,026,269 | 5/1977 | Stelzer | 126/438 |
| 4,099,515 | 7/1978 | Schertz | 126/438 |
| 4,106,483 | 8/1978 | Barber | 126/424 |
| 4,119,365 | 10/1978 | Powell | 126/438 |
| 4,120,282 | 10/1978 | Espy | 126/438 |
| 4,134,387 | 1/1979 | Tornstrom | 126/438 |
| 4,148,301 | 4/1979 | Cluff | 126/438 |
| 4,162,824 | 7/1979 | Ma | 126/439 |
| 4,184,482 | 1/1980 | Cohen | 126/438 |
| 4,214,572 | 7/1980 | Gonder | 126/438 |
| 4,239,034 | 12/1980 | Niedermeyer | 126/439 |

Primary Examiner—Daniel J. O'Connor

[57] ABSTRACT

Solar energy concentrator system employs structure permitting ready adjustability of flexible sheet concentrators to maximize solar radiation reflectability therefrom in accordance with seasonal posture of the sun. The invention utilizes structural components which represent various parameters of an ellipse. Thus, the concentrators are shaped in the form of an inverted-V and their apexes shiftable, by means of a pivotable rod, along a curve of substantially constant radius when the free ends of the concentrators are substantially secured at points forming the foci of the ellipse to thereby vary the angles the faces of the concentrators make with the sun.

11 Claims, 6 Drawing Figures

SOLAR ENERGY CONCENTRATOR SYSTEM

STATEMENT OF THE INVENTION

This invention relates to solar energy and concerns solar concentrators for increasing the intensity of solar radiation on collecting surfaces. More particularly, the invention concerns arrays of solar energy concentrators which are readily adjustable to efficiently receive radiation from the sun in accordance with its seasonal posture.

BACKGROUND AND SUMMARY OF THE INVENTION

In an era of dwindling fossil fuel supplies and continuously rising cost of energy obtained therefrom, as well as a vigilant concern for the environment, solar radiation represents an almost unending source of energy which is clean and non-polluting. Principal obstacles to wide scale adoption of solar energy have been the relatively high cost of component parts of solar energy systems and installation thereof.

Many current solar energy conversion systems employ solar energy concentrators which are adapted to collect and focus the sun's energy onto solar cells or thermal converters by means of reflecting or refracting devices. Such systems and apparatus associated therewith have not been wholly satisfactorily, not only because of their initial cost and maintenance, but, among others, to various problems involved in their adjustment and seasonal tilting.

The present invention employs concentrators or reflectors comprising a transparent thermoplastic material having a thin film of a suitable metal disposing thereon, such as by vapor deposition. The coated film may be protected from the elements by known protective coatings and an array of such reflectors installed in operable relationship with photovoltaic cells or panels for optimally receiving and converting the sun's energy.

In many prior art installations, the arrays are required to be seasonally tilted for optimum angular inclination to the sun's rays. Such tilting apparatus is oftentimes complex, cumbersome and heavy. Yet other installations require servomechanisms, cam-linkage arrangements, and the like, which add to the cost and complexity of the installations as well as requiring periodic maintenance checks.

The present invention employs concentrators or reflectors which are readily adjusted by the simple expediency of sliding a control rod or bar to cause a plurality of arm members communicating between the control rod and reflector rods which form the apex of the reflectors to simultaneously pivot to thereby change the angle at which the reflectors are disposed. The length and positioning of the arm members bears a definite relationship to the mathematical laws governing an ellipse; and the reflectors, formed into an inverted V-shape, have their ends substantially affixed to structure at points which define the foci of the ellipse. The apexes of the inverted V-shaped reflectors are substantially coincident with the unpivoted ends of the arm members and by means of structure later described, are caused to pivot in unison in response to movement or sliding of the control rod or bar to thereby shift the apexes accordingly for changing the angle at which the reflectors address the sun. The structure is simple to construct, inexpensive, reliable, substantially free of maintenance, and requires no tilting of the arrays and only the sliding of one or more control rods several times a year, i.e., to accommodate the changing seasons.

DETAILED DESCRIPTION OF THE INVENTION

Figure 1:
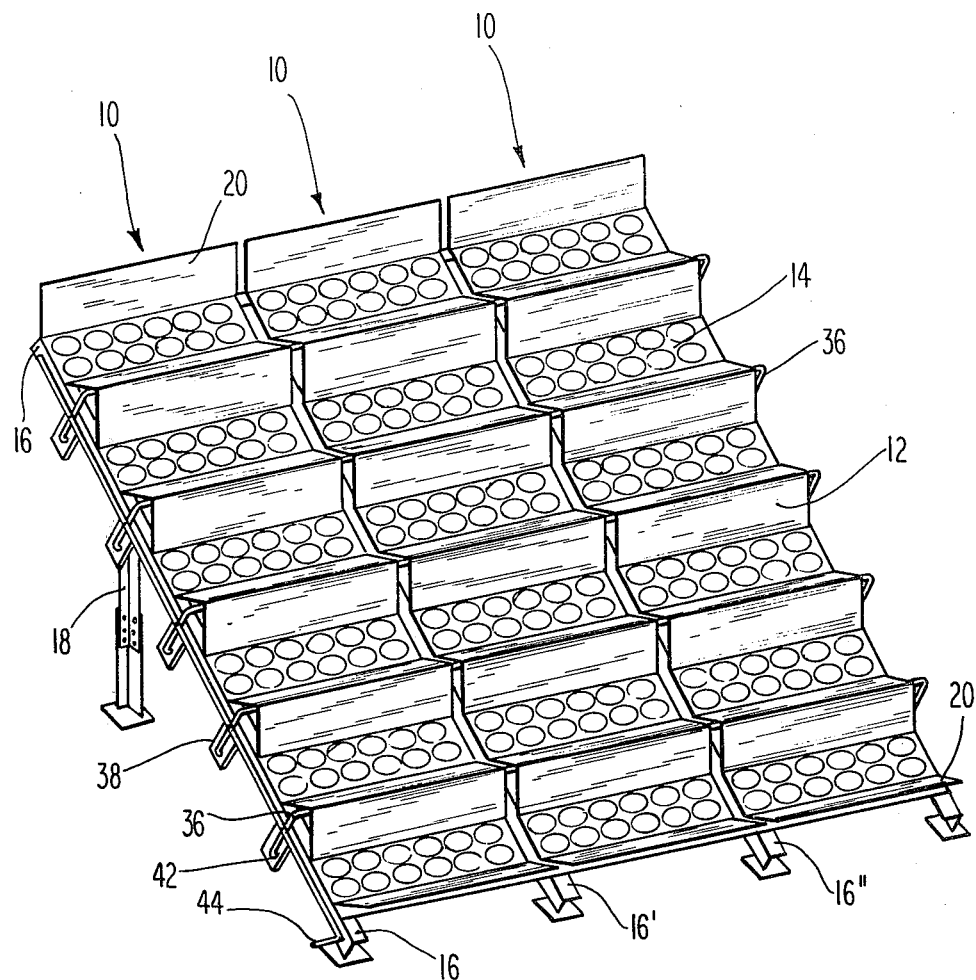
FIG. 1 is a perspective view of arrays of solar concentrators of the present invention and components associated therewith.

FIG. 1 illustrates a plurality of arrays 10 of solar concentrators comprising individual concentrators or reflectors 12 and photovoltaic cells or panels 14, all supported on a plurality of spaced support members 16, 16', 16'', and so on, typically angle irons. The latitude of the arrays are adjusted by means of adjustable vertical supports 18 secured to support members 16, etc.

The reflectors comprise a transparent thermoplastic base material of Kynar, for example, a polyvinlyidene fluoride product of Pennwalt Corp., Philadlephia, Pennsylvania, assignee of the present invention. The Kynar has a thin film of aluminum, or the like, suitably deposited thereon, protected by a transparent coating of a protective material having high strength and good outdoor weathering properties, typically acrylic compositions. The thin film or sheet of reflector 12 will have a thickness of 5 mils or so, the aluminum comprising about 20% thereof with the balance being divided approximately between the Kynar and acrylic protective layer. The invention is not intended to be limited to a Kynar base material since polyesters such as polyethylene terephthalate, for example, among others, has been found to work quite satisfactorily.

Photovoltaic cells 14 are preferably of the well known silicon type, and are capable of generating an electrical current from the sun's radiations.

End reflectors 20 may be metallic, typically polished aluminum, and suitably secured in operable relationship to solar panels 14.

Figure 2:
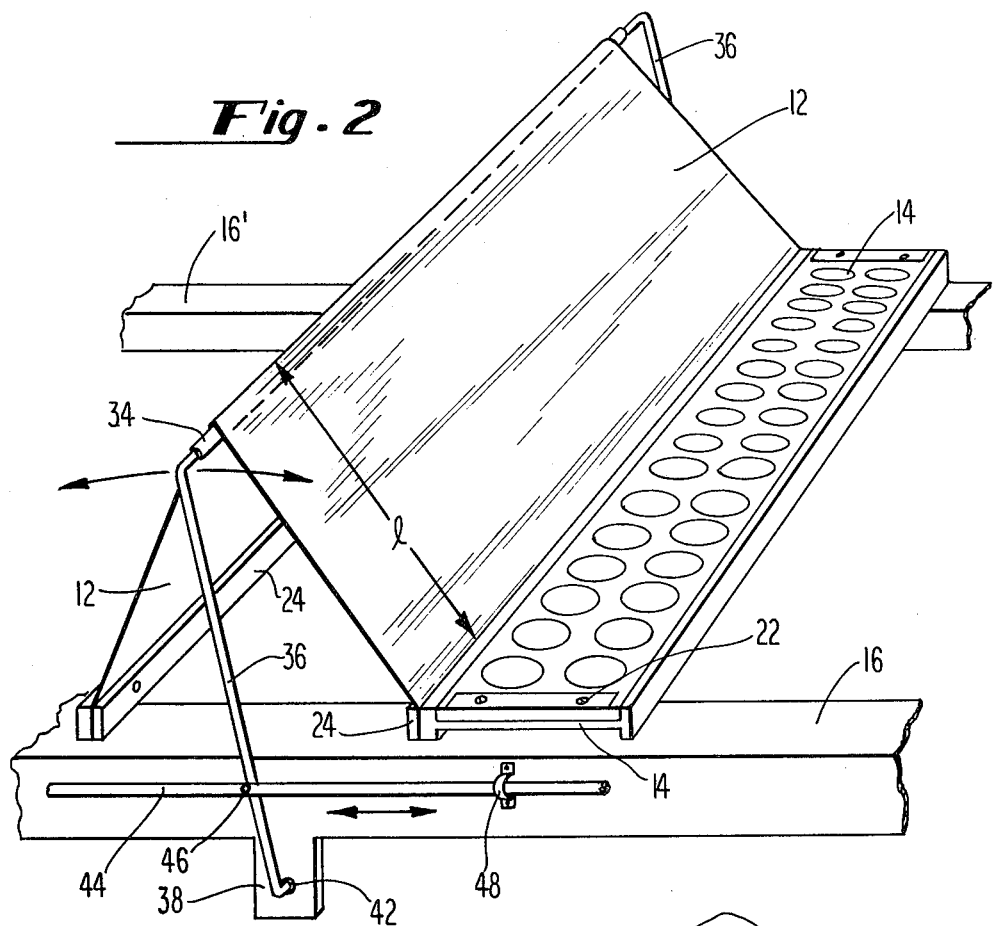
FIG. 2 is a fragmentary perspective view of a reflector and an adjacent photovoltaic cell or panel of the array illustrated in FIG. 1, and means for varying the angle of disposition of the faces of the reflector.
Figure 3:
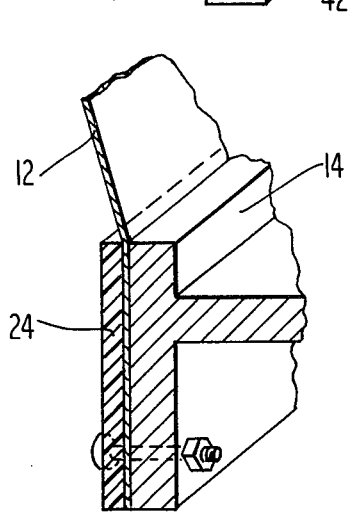
FIGS. 3 and 4 illustrate embodiments of means for affixing free ends of the inverted V-shaped reflectors at foci of an imaginary ellispe.
Figure 4:
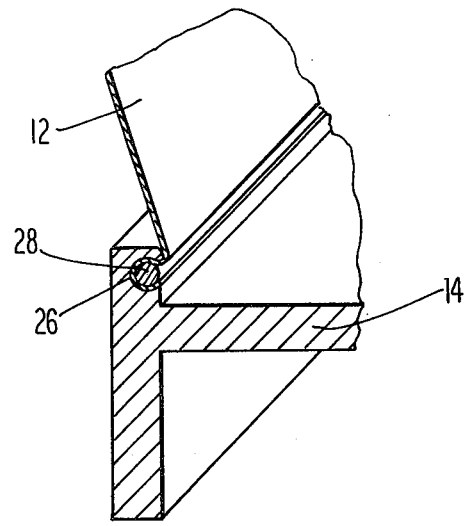

Referring additionally to FIGS. 2, 3, and 4 of the drawings, solar panels 14 are affixed to support members 16 by screws 22. In typical embodiments of the invention, reflectors 12 are secured to panels 14 by means of strip member 24, or, the reflector may be secured within a longitudinal channel 26 provided in panel 14 which received welting 28 wedged within channel 26 together with the reflector. Strip members 24 and weltings 28 may be fabricated from rubber, plastic, or other like material.

Figure 5:
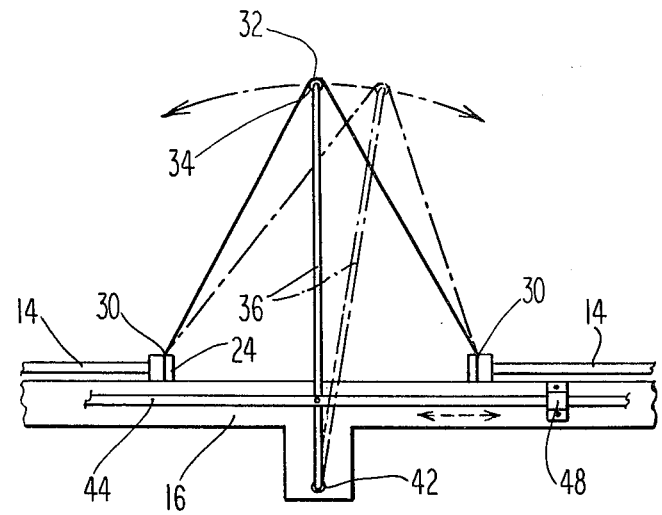
FIG. 5 is a diagrammatic illustration showing how reflector face angles may be changed by a pivotal arm, both the faces and arm being assigned specific lengths and locations defining parameters of an ellipse.

By virtue of strip members 24 and weltings 28 securing reflectors 12 to solar panels 14, the reflectors may be considered to be affixed to the panels at points which define the foci 30 (FIG. 5) of an imaginary ellipse. The apex of the ellipse is formed by means of a reflector rod 34 having arms 36 pivotable on support members 16, 16", etc. at extensions 38 depending therefrom. The pivot points are designated by the numeral 42.

A control bar or rod 44 is supported for longitudinal movement along a support member 16 of each array 10, and is pivotably connected to arms 36, suitably by pins 46, such that movement of rod 44 will cause reflector rods 34 to vary the position of apex 32 to thereby vary the angle the faces of the reflectors make with the sun's radiations. Oversized guides 48, mounted to the vertical faces of support members 16, 16', etc. guide the longitudinal movement of the control rods.

It is understood that the pivot point 42 which is adjacent support member 16', for example, may be mounted on a suitable lateral extension therefrom (not shown) to resemble extension 38 depending from support member 16. Alternatively, a suitable longitudinal support member (also not shown) in close parallel relationship to support member 16' may provide structure from which pivot point 42 may be conveniently mounted.

As illustrated in FIG. 1 however, a single control rod 44 may control reflector angles for all reflectors 12 for each of the arrays 10 simultaneously.

The length of each arm 36 is made numerically equal to $A^2/B$ where A and B represent ½ the lengths of the major and minor axes respectively of the ellipse.

A is made equal to the length 1 (FIG. 2) of reflector 12 when arm 36 is perpendicularly disposed to the major axis, i.e., a line drawn between the focal points 30.

B is assigned a length equivalent to the length of arm 36 when the arm is perpendicularly disposed from apex 32 to a point where arm 36 intersects a line connecting the focal points 30.

An ellipse may be defined as a closed plane curve generated by a point moving in such a way that the sum of its distances from two fixed points, or foci, is a constant. Since the unpivoted end of each arm 36 is approximately coincident with reflector rod 34 and apex 32, it is apparent, that for the small angular changes in reflector angles required to accommodate the seasonal changes of the sun, the radius of curvature of the unpivoted end of arm 36 may be assumed to be substantially constant when arm 36 is caused to be pivoted to another position, as illustrated by the phantom lines of arm 36 in FIG. 5. It is appreciated that a 20° change in the sun's angle, for example, may be accommodated by only a 10° change in the reflector angles.

Further, reflector rods 34 are selected to possess a slight degree of flexibility to compensate for changes in dimension of the film reflector due to environmental changes; and for maintaining the film reflectors in a proper degree of tension.

Film reflectors 12 need not be individually affixed to solar panels 14 by strip members 24 or weltings 28. Reflectors 12 for each array 10 may comprise a single film or sheet which is "threaded" over reflector rod 34 to form the apex 32 of each reflector; then below solar panel 14 by passing through guide rods 52, one each suitably attached to the sides of panel 14; and up again to a succeeding reflector rod 34, and so on, as shown on FIG. 6. It is noted that film reflectors 12 contact solar panels 14 substantially identically as illustrated in the embodiments of FIGS. 3 and 4. By referring to the several equations defining lengths of arm 36, length 1, and B, proper component lengths are readily calculable as well as relative positioning of the several components within the imaginary ellipse. The width w of each reflector 12 of FIG. 6 is less than that illustrated in FIG. 2 in order that it may be continuously threaded, as aforedescribed, without interference from support members 16, 16', etc.

Figure 6:
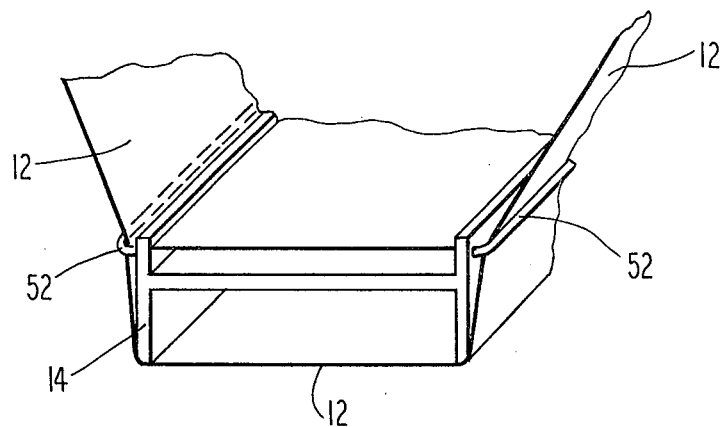
FIG. 6 is a fragmentary perspective view of a modification of the invention illustrated in FIG. 2.

The modification illustrated in FIG. 6 operates substantially to that of FIG. 2. As control rod 44 is moved longitudinally, arms 36 are caused to pivot to vary reflector angles. To achieve maximum output from each of the abovediscussed embodiments or modifications, reflector angles may be adjusted continuously with a suitable motor driven servo system which sense the sun angle after rays from the sun are reflected onto the solar panels.

Changing of the tilt angle of the arrays is not necessary. All adjustments may be readily accomplished by merely varying the reflector angles in response to longitudinal movement of control rods 44. It is appreciated that a particular advantage is gained from practicing the present invention when heat collectors are used therewith. That is, the solar panels are permitted to remain stationary, obviating any need for flexible or swivel connections for fluid inlets and outlets resulting in considerable savings in cost and maintenance.

The present solar energy concentrator system may be made even more efficient by arranging suitable backing wire to the reflectors to cause them to approximate compound parabolic concentrators.

Suitable dimensions for each face of reflectors 12 are about 12"×22–24"; for panels 14, about 5"×24".

I claim:

1. A solar energy concentrator system comprising
 a flexible sheet material reflective of radiation from the sun, said sheet forming a V-shaped concentrator having an apex and a pair of free ends,
 a plurality of support members,
 collecting means secured across said support members, each of said free ends secured to a different one of said collecting means at opposing support points,
 an apex-forming member articulating with pivoting means pivotable on said support members at pivot points substantially equidistant from said opposing support points, and
 means for pivoting said pivoting means to thereby shift said apex for varying angle that a face of said concentrator makes with the sun, said collecting means collecting sun's radiation reflected from said concentrator.

2. The system of claim 1 wherein said opposing support points define foci of an ellipse.

3. The system of claim 2 wherein said pivoting means comprises a pair of arms moving in unison in response to said means for pivoting said pivoting means, said apex forming member comprising a rod interconnecting said pair of arms.

4. The system of claim 3 wherein each of said arms has a length numerically equal to $A^2/B$ where A and B represent ½ the lengths of major and minor axes respectively of said ellipse.

5. The system of claim 4 wherein A equals length of a face of said concentrator when one of said arms is perpendicularly disposed to a line defining said major axis.

6. The system of claim 4 wherein B equals length of said arm when substantially coincident with apex of said concentrator to a point defined by intersection of said arm at right angles to said major axis.

7. The system of claim 1 further characterized by said system comprising a plurality of inverted V-shaped concentrators, each of said plurality of concentrators having one of said collecting means disposed therebetween, said collecting means secured transversely across said support members.

8. The system of claim 7 wherein each of said collecting means comprises a solar panel, each of said panels having a strip member attached thereto for securing said free end of said flexible sheet material therebetween.

9. The system of claim 3 wherein said means for pivoting said pivoting means comprises
a control rod mounted for longitudinal movement along one of said support members.

10. A solar energy concentrator system comprising
a continuous flexible sheet material reflective of radiation from the sun, said sheet forming a plurality of spaced inverted V-shaped concentrators, each of said concentrators having an apex,
a plurality of support members,
an apex-forming member articulating with pivoting means pivotable on said support members at pivot points,
collecting means disposed in spaces between said concentrators to provide alternate concentrators and collecting means, said continuous flexible sheet passing under each of said collecting means to contact lower edges thereof to provide contact points such that each of said apexes of said concentrators is substantially midpoint of a pair of contact points formed from adjacent collecting means forming foci of an imaginary ellipse,
means for pivoting said pivoting means to thereby shift each of said apexes for varying angle that faces of said concentrators make with the sun,
said arms having a length equal to $A^2/B$ where A and B represent $\frac{1}{2}$ the lengths of major and minor axes respectively of said ellipse,
said collecting means collecting sun's radiation reflected from said plurality of concentrators.

11. The system of claim 10 further characterized by a guide rod secured to an upper portion of each side of each of said collecting means for guiding said continuous flexible sheet therebelow prior to formation of a succeeding concentrator.

* * * * *